United States Patent
Beck et al.

(10) Patent No.: US 12,241,951 B2
(45) Date of Patent: Mar. 4, 2025

(54) TRUSTWORTHY COMPONENT FOR A CONTROL PATH OF A MAGNETIC RESONANCE APPARATUS

(71) Applicant: Siemens Healthcare GmbH, Erlangen (DE)

(72) Inventors: Thomas Beck, Dormitz (DE); Swen Campagna, Engelthal (DE)

(73) Assignee: Siemens Healthineers AG, Forchheim (DE)

( * ) Notice: Subject to any disclaimer, the term of this patent is extended or adjusted under 35 U.S.C. 154(b) by 110 days.

(21) Appl. No.: 18/102,672

(22) Filed: Jan. 27, 2023

(65) Prior Publication Data

US 2023/0243903 A1   Aug. 3, 2023

(30) Foreign Application Priority Data

Jan. 28, 2022   (DE) ...................... 10 2022 200 942.8

(51) Int. Cl.
*G01V 3/00* (2006.01)
*G01R 33/28* (2006.01)

(52) U.S. Cl.
CPC ................. *G01R 33/288* (2013.01)

(58) Field of Classification Search
CPC .............. G01R 33/3415; G01R 33/543; G01R 33/5659; G01R 33/36; A61B 5/055
USPC ......................................................... 324/307
See application file for complete search history.

(56) References Cited

U.S. PATENT DOCUMENTS

| | | | |
|---|---|---|---|
| 7,715,899 B2 * | 5/2010 | Harvey ................ | G01R 33/543 |
| | | | 324/309 |
| 2011/0043204 A1 | 2/2011 | Bielmeier et al. | |
| 2021/0356538 A1 | 11/2021 | Schneiderbanger et al. | |

FOREIGN PATENT DOCUMENTS

| | | | |
|---|---|---|---|
| DE | 102009038139 A1 | 2/2011 | |
| DE | 102020206063 A1 | 11/2021 | |
| JP | 2009278093 A * | 11/2009 | ........... F25D 19/006 |

OTHER PUBLICATIONS

International Electrotechnical Commission. "Medical device software—Software life cycle processes." IEC 62304 Ed. 1.1 (Jun. 2015).
International Electrotechnical Commission. "Medical electrical equipment—Part 2-33: Particular requirements for the basic safety and essential performance of magnetic resonance equipment for medical diagnosis." IEC 60601-2-33 Ed. 4.0 (Aug. 2022).
International Electrotechnical Commission. "Medical electrical equipment" IEC 60601-1. Edition 3.0 ISBN 2-8318-8400-4. pp. 1-792. (Dec. 2005).

* cited by examiner

Primary Examiner — Walter L Lindsay, Jr.
Assistant Examiner — Frederick Wenderoth
(74) Attorney, Agent, or Firm — Lempia Summerfield Katz LLC

(57) ABSTRACT

A trustworthy component for a control path of a magnetic resonance apparatus and a magnetic resonance apparatus with at least one trustworthy component are provided. The trustworthy component is configured to be arranged in a control path of a safety-relevant function of a magnetic resonance apparatus, so that when the trustworthy component is arranged in the control path, the control path is, at least in parts, non-trustworthy.

12 Claims, 5 Drawing Sheets

TRUSTWORTHY COMPONENT FOR A CONTROL PATH OF A MAGNETIC RESONANCE APPARATUS

This application claims the benefit of German Patent Application No. DE 10 2022 200 942.8, filed Jan. 28, 2022, which is hereby incorporated by reference in its entirety.

BACKGROUND

The present embodiments relate to a trustworthy component for a control path of a magnetic resonance apparatus and a magnetic resonance apparatus with at least one trustworthy component.

In a magnetic resonance examination of a patient (e.g., during the performance of a magnetic resonance tomography (MRT) or magnetic resonance imaging (MRI)) for the capture of magnetic resonance signals, radio frequency signals and/or radio frequency fields may be used by a magnetic resonance apparatus to stimulate atomic nuclei and magnetic fields (e.g., gradient fields are used for spatial encoding according to a scan protocol). In order to generate the gradient fields, the magnetic resonance apparatus typically has a gradient coil unit that is controlled by at least one gradient control unit. Further, the magnetic resonance apparatus may include a radio frequency antenna unit with which the radio frequency signals may be generated; the radio frequency antenna unit may be controlled by at least one radio frequency antenna control unit.

On realization of a functionality that carries a risk to a patient with a high level of severity and a corresponding frequency of occurrence, a realization that maintains functional safety aspects is to be provided. For example, with increasing performance of the magnetic resonance apparatus with regard to gradient strength and radio frequency power level, risks to the patient may arise, for example, from stimulation of the heart muscle of the patient as a consequence of a voltage induced in the tissue by strong gradient fields and/or overheating of the tissue of the patient from strong radiated-in radio frequency power levels.

A complicating factor that arises, for example, is that any implants situated in the body of the patient may locally bundle both magnetic fields and radio frequency fields (e.g., via action as a passive antenna). This may lead to a local field superelevation such that higher field strengths may arise in the body of the patient than is the case without implants. For the operation of a magnetic resonance apparatus, it is therefore important, for example, to restrict the slew rate of the gradient field and/or the power level of the radio frequency signal.

Functionally safe architectures may be used to provide a first error safety so that a first occurring error in the context of a calculation of an item of control information (e.g., of a control signal) causes no endangering, for example, of the patient and/or the magnetic resonance apparatus.

For example, conventional functionally safe architectures are implemented via a trustworthy control path that realizes the control task of the medical product and a protect path that realizes the monitoring task of the control path.

Given the existence of a non-trustworthy control path, an architecture may alternatively be selected with the use of two independent protect paths for monitoring. A non-trustworthy control path exists, for example, if the implementation of the control path is only realized retrospectively, for example, by a customer or by an inexactly defined and controlled development process. Further, diverse inventory systems also exist that have been realized at an earlier time point without the aim of a functionally safe implementation according to present-day procedures and architectures.

SUMMARY AND DESCRIPTION

The scope of the present invention is defined solely by the appended claims and is not affected to any degree by the statements within this summary.

The present embodiments may obviate one or more of the drawbacks or limitations in the related art. For example, reliability and/or safety level (e.g., a functional safety) of magnetic resonance apparatuses may be improved in an efficient manner.

Accordingly, a trustworthy component that is configured to be arranged in a control path (or C-path) of, for example, a safety-related function of a magnetic resonance apparatus is provided, so that if the trustworthy component is arranged in the control path, an item of control information processed in the control path has at least one property that is predetermined (e.g., guaranteed) in a portion of the control path subsequent to (e.g., immediately following) the at least one trustworthy component.

For example, the at least one trustworthy component is configured so that if the trustworthy component is arranged in the control path, the control information item processed and, for example, output via the trustworthy component has the at least one predetermined property at a location at which the at least one trustworthy component is arranged in the control path.

In one embodiment, the at least one trustworthy component has a signal input with which the control information item may be received (e.g., coming from another component of the control path). In one embodiment, the at least one trustworthy component has a signal output with which the control information item may be output to a further component of the control path. In one embodiment, a maintenance of the at least one property of the control information processed in the control path is guaranteed at the signal output of the trustworthy component.

In one embodiment, the trustworthy component passes on the control information items following successful testing of a signal input of the trustworthy component to the signal output of the trustworthy component; if the test is not successful, a suitable measure is taken. Depending upon the task of the trustworthy component, this measure may be, for example, a cessation of the execution of the control information or a modification of the control information.

The cessation of the execution of the control information item may take place, for example, with a "hard stop" that may include, for example, an interruption of the control information flow and/or an output of an error message to an operating person of the magnetic resonance apparatus.

A possible modification of the control information may include, for example, an at least temporary transfer of the control information into a modified control information item that meets the required properties. This modified control information item may fulfil the properties of a safe condition in the context of IEC 60601-2-33 (e.g., the properties of a safe state). Provided a modification of the control information enables a continuation of the scan, the cessation of the scan preferably may be prevented.

The checking of the properties to be guaranteed may be both simpler (e.g., including a limit value checking of individual values and/or of sliding average values, an observation of sliding windows, a trustworthy adjustment of redundant sensor information) and also more complex (e.g., including a calculation of a specific absorption rate (SAR)

model for radio frequency radiation that is to be radiated in and/or a model of a stimulation of a heart and/or a peripheral nervous system (PNS) of the patient for a gradient activity).

With the aid of the control information and/or a control information stream, a control command may be executed, and/or a control task is carried out. The at least one trustworthy component may be a component as part of a processing chain of the control information (e.g., a control information stream). The at least one predetermined property may be a quantifiable and/or safety-relevant property. The trustworthy component may check that the control information complies with predetermined limit values (e.g., the at least one predetermined property may relate to the compliance with such predetermined limit values). The at least one predetermined property may relate, for example, to a limit of an activity of the magnetic resonance apparatus, such as, for example, a limit of an energy input of radio frequency radiation (e.g., for compliance with a maximum SAR), a gradient activity (e.g., for compliance with stimulation thresholds for the heart and/or the peripheral nervous system (PNS) of the patient), a noise development, and/or an energy usage.

In one embodiment, the at least one property involves an activity that is capable of causing personal damage (e.g., to the patient being examined by the magnetic resonance investigation) and/or material damage (e.g., to the magnetic resonance apparatus). In one embodiment, the at least one property is configured to realize a first-failure safety and thus to design a functionally safe architecture.

For example, the trustworthy component is configured so that if the trustworthy component is arranged in the control path, the control path is, at least in parts, not necessarily trustworthy and/or does not need to be trustworthy. The not necessarily trustworthy portion of the control path is hereinafter designated "non-trustworthy portion". The trustworthy component may be a barrier that divides the control path into a trustworthy portion and a non-trustworthy portion. The non-trustworthy portion of the control path may be characterized in that lesser requirements for development and/or for operation of the function (e.g., the safety-relevant function) are placed on the non-trustworthy portion of the control path. In a non-trustworthy portion, it is not necessary to guarantee a correct calculation of a control information item within this portion of the control path (e.g., in the sense of a first-failure safety).

The control path may have a processing chain of the control information and/or a control information stream for control of a function (e.g., a safety-relevant function) of the control path. This function may be, for example, a control task. For example, the control path is a carrier of a control information stream. With the aid of the control information and/or the control information stream, a function (e.g., a safety-relevant function) may be controlled. The control information and/or the control information stream may describe a commissioned activity and/or control variable that defines and/or influences an execution of the function (e.g., the safety-relevant function). A function of this type may be, for example, a measuring process of, for example, the magnetic resonance apparatus. The control information and/or the control information stream may be initiated, for example, by a command source unit in the control path. The command source unit may be, for example, a first and/or initial element of a processing chain of the control information in the control path. The at least one commissioned activity and/or control variable may be commissioned, for example, by a command source unit. A possible endangering may be caused, for example, by an erroneous commissioning (e.g., intentional or unintentional) and/or by an error (e.g., an erroneous processing of the control information) in the (further) control path.

The control path may include, for example, elements that contribute to a controlled operation of a function (e.g., safety-relevant function) of the magnetic resonance apparatus. For example, the control path realizes an embodiment of the, for example, safety-relevant function. For example, the control path realizes a correct implementation of functions that have a safety relevance. This provided, for example, that a faulty implementation of such a function may entail harm to the patient and/or material.

For example, the control path includes a control unit that is configured to receive input signals, process the input signals, and emit output signals. The input signals may include, for example, setpoint values for carrying out an imaging magnetic resonance sequence. Further, the input signals may include, for example, actual values that characterize an actual state of a function (e.g., safety-relevant function) of the control path. In one embodiment, the control unit is configured, for example, based on the setpoint values and the actual values, to carry out a function (e.g., safety-relevant function) of the control path.

To be delimited from the control path are any protect paths (P-paths) of the magnetic resonance apparatus. These may include, for example, elements that contribute to a monitoring of the function (e.g., safety-relevant function) of the control path. For example, protect paths may include sensors and/or detectors for capturing a safety-relevant parameter.

In one embodiment, a control path is then non-trustworthy (e.g., partially non-trustworthy) if the first-failure safety of the control information item calculated in this portion cannot or must not be secured.

In one embodiment, the at least one trustworthy component is configured to monitor one or more framework conditions of a required first safety and/or to ensure compliance with existing limit values and/or properties of a control task that is to be fulfilled with the control path. The at least one trustworthy component may fulfil requirements that are defined in the relevant standards such as Section 4.7 of IEC 60601-1, IEC 62304 and/or IEC 60601-2-33.

In one embodiment, by way of an arrangement and/or implementation of a trustworthy component in a control path of a magnetic resonance apparatus, also subsequently, in already existing magnetic resonance apparatuses, an at least portion-wise non-trustworthy control path may be created.

In one embodiment, an arrangement of a trustworthy component in a control path enables any non-trustworthy portions of the control path to be (further) modified without compliance with any framework conditions of a risk.

Further, a magnetic resonance apparatus is provided. Therein, the magnetic resonance apparatus includes at least one trustworthy component and at least one control path of a safety-relevant function, where the at least one trustworthy component is arranged in at least one control path.

In one embodiment, the magnetic resonance apparatus includes one (e.g., exactly one) protect path for the function (e.g., safety-relevant function) for, for example, monitoring the control path of the, for example, safety-relevant function.

In one embodiment, by way of the trustworthy component, an otherwise possibly necessary second, independent protect path may be avoided. In one embodiment, a portion-wise non-trustworthy control path is also acceptable without a safety risk to a patient to be investigated by the magnetic resonance apparatus and/or to the magnetic resonance apparatus itself thereby being increased. A possibly increased demand on a reaction time of the protect path on detection of an exceeding of a limit value for triggering any necessary measures may be dispensed with.

A possible embodiment of the magnetic resonance apparatus provides that the at least one control path has a command source unit for generating a control command described, for example, by the control information, where the at least one control path has a command execution unit for executing the control command, and the command source unit and the command execution unit are arranged at different ends of the control path in which the control command is processed. In one embodiment, the portion from the command source unit to the trustworthy component is a non-trustworthy portion of the control path, and the portion from the trustworthy component to the command execution unit is a trustworthy portion of the control path. In one embodiment, the non-trustworthy portion may be developed with only a small effort and also altered flexibly. For example, the users of the magnetic resonance apparatus may also carry out a modification of the non-trustworthy portion of the control path without the safety of the patient and/or the magnetic resonance apparatus thereby being impaired. This may be helpful, for example, in the development of prototypes.

For example, the at least one control path may have a command source unit for generating a control command described, for example, by the control information, where the at least one control path has a command execution unit for executing the control command, and the command source unit and the command execution unit are arranged at different ends of a processing chain. The at least one trustworthy component is arranged within (e.g., between the ends of) the processing chain.

The command source unit may be a unit in which the control information (e.g., the control command and/or a control signal representing the control command) is generated. For example, a control task of the safety-relevant function is specified by the command source unit.

In one embodiment, the at least one trustworthy component is inserted at a suitable site of the control path (e.g., the processing chain of the control path). For example, the at least one trustworthy component is inserted so that on further processing of the control information and/or on a further execution of the control command (e.g., on execution of a control task), a further compromising of a control signal representing the control command or non-compliance with framework conditions of the risk may be precluded.

The positioning of the trustworthy component may take place, in principle, at different positions of the control path and/or the processing chain of the control signal.

In one embodiment, the at least one trustworthy component in the control path and/or in the processing chain is arranged closer to the command execution unit than to the command source unit. For example, the at least one trustworthy component in the control path and/or in the processing chain is arranged directly before the command execution unit. In one embodiment, the trustworthy component is situated as far back as possible in the control path and/or in the processing chain of the control task. In this way, the non-trustworthy portion may be configured particularly large, and thereby, a large portion of the control path may be relieved from a safety argumentation. In the selection of the position of the trustworthy component, account may be taken of the effort with which, in the context of the functional safety (e.g., first-failure safety) the subsequent safety-worthy portion of the control path may be made sufficiently loadable.

One embodiment of the magnetic resonance apparatus provides that the control path and/or the processing chain has a software part and a hardware part, where the at least one trustworthy component is arranged at a transition (e.g., at an interface) between the software part and the hardware part. For example, the software part is closer to the command source unit than the hardware part.

By way of such an arrangement, it may be achieved that lesser demands have to be placed upon a development of the software part that is situated in the control path and/or in the processing chain before the trustworthy component (e.g., in the non-trustworthy portion of the control path). Possibly, a development of the software part under class C aspects (in accordance with IEC 62304) may be avoided. Changes to the non-trustworthy portion may also be carried out more easily with a reduced safety classification of the software code (e.g., no requirements according to class A).

An interface between the software and the hardware may be a central interface of the magnetic resonance apparatus, so that only an arrangement of a trustworthy component at this interface is sufficient and the use of a plurality of trustworthy components at a plurality of interfaces distributed in the magnetic resonance apparatus may be avoided.

For example, a magnetic resonance apparatus is provided where the at least one control path has a radio frequency chain (e.g., a radio frequency transmitting chain (as a processing chain)). The radio frequency chain has a software part with a user interface. The radio frequency chain has a hardware part with a radio frequency antenna control unit and/or a radio frequency antenna unit (e.g., for transmitting radio frequency signals). The at least one trustworthy component is arranged between the software part and the hardware part.

In one embodiment, the software part therein is at the beginning of the control path and/or the processing chain, and the hardware part is at the end of the control path and/or the processing chain. In one embodiment, the portion that is situated in the control path and/or in the processing chain behind the trustworthy component (e.g., closer to the command execution unit) may be considered and/or configured as a trustworthy portion. However, the portion that is situated in the processing chain before the trustworthy component (e.g., closer to the command source unit) may be considered and/or configured as a non-trustworthy portion. For example, the hardware part may be a trustworthy portion of the control path and/or the processing chain, and the software part may be a non-trustworthy portion of the control path and/or the processing chain.

For example, a magnetic resonance apparatus is provided, where the at least one control path has a radio frequency chain (e.g., as a processing chain). The radio frequency chain has a user interface, a system control unit, a radio frequency antenna control unit, and a radio frequency antenna unit (e.g., for transmitting radio frequency signals). The at least one trustworthy component is arranged between the user interface and the system control unit, between the system control unit and the radio frequency antenna control unit, or between the radio frequency antenna control unit and the radio frequency antenna unit.

The radio frequency antenna control unit may include, for example, a modulator and/or an RF amplifier. The radio frequency antenna unit may include, for example, a body coil firmly installed in the magnetic resonance apparatus.

If the trustworthy component is arranged, for example, between the system control unit and the radio frequency antenna control unit, from the position of the trustworthy component, just one further conversion of the signal progress, for example, takes place, but no further complex algorithms for modifying the control signal take place; rather, from this position, only an execution of the control signal by the radio frequency antenna control unit and/or the radio frequency antenna unit takes place. Indeed, the data stream of the control system may then still be significantly modified after the position of the trustworthy component, but, for example, the original control instruction may no longer be modified; rather, a correct execution of the control instruction takes place with the aid of the hardware. For this purpose, complex calculations may be required, but the intended effect (e.g., a desired RF pulse sequence) may no longer change.

If the trustworthy component is arranged between the radio frequency antenna control unit and the radio frequency antenna unit, the trustworthy component may be positioned particularly far back in the control path and/or in the processing chain. In one embodiment, a particularly large part of the control path and/or of the processing chain may be regarded as a non-trustworthy portion, so that the particularly large part of the control path and/or of the processing chain may be realized and/or amended with little effort.

For example, a magnetic resonance apparatus in which the at least one control path has a gradient chain (e.g., as a processing chain) is provided. The gradient chain has a software part with a user interface. The gradient chain has a hardware part with a gradient control unit and/or a gradient coil unit. The at least one trustworthy component is arranged between the software part and the hardware part.

In one embodiment, the software part is therein situated at the beginning of the control path and/or the processing chain, and the hardware part is situated at the end of the control path and/or the processing chain. In one embodiment, the portion that is situated in the control path and/or in the processing chain behind the trustworthy component (e.g., closer to the command execution unit) may be considered and/or configured as a trustworthy portion. However, the portion that is situated in the control path and/or in the processing chain before the trustworthy component (e.g., closer to the command source unit) may be considered and/or configured as a non-trustworthy portion. For example, herein, the hardware part may be a trustworthy portion of the processing chain, and the software part may be a non-trustworthy portion of the control path and/or the processing chain.

For example, a magnetic resonance apparatus where the at least one control path has a gradient chain (e.g., as a processing chain) is provided. The gradient chain has a user interface, a system control unit, a gradient control unit, and a gradient coil unit. The at least one trustworthy component is arranged between the user interface and the system control unit, between the system control unit and the gradient control unit, or between the gradient control unit and the gradient coil unit.

The gradient control unit may include, for example, a gradient amplifier. The gradient coil unit may include, for example, a plurality of (e.g., three orthogonal) gradient coils.

If the trustworthy component is arranged, for example, between the system control unit and the gradient control unit, from the position of the trustworthy component, just one further conversion of the signal progress, for example, takes place, but no further complex algorithms for modifying the control signal take place; rather, from this position, only an execution of the control signal by the gradient control unit and/or the gradient coil unit takes place. Indeed, the data stream of the control system may then still be significantly modified after the position of the trustworthy component, but the original control instruction may no longer be modified; rather, a correct execution of the control instruction takes place with the aid of the hardware. For this purpose, complex calculations may be required, but the intended effect (e.g., a desired gradient field) may no longer be changed.

BRIEF DESCRIPTION OF THE DRAWINGS

Further advantages, features, and details of the invention are disclosed in the description of exemplary embodiments below and from the drawings. Parts that correspond to one another are provided with the same reference characters in all the figures, in which.

DETAILED DESCRIPTION

Figure 1:
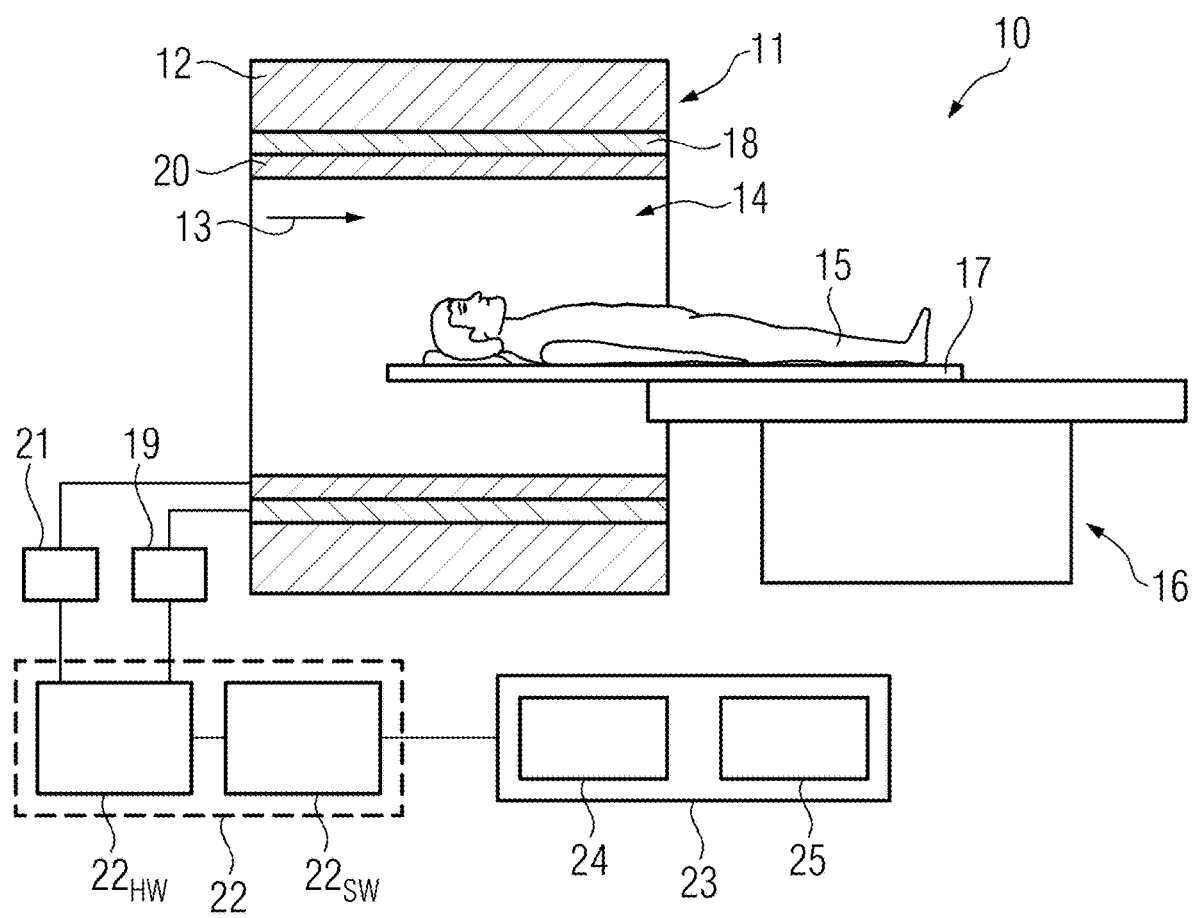
FIG. 1 shows a schematic representation of a magnetic resonance apparatus.

FIG. 1 shows one embodiment of a magnetic resonance apparatus 10 in a schematic view. The magnetic resonance apparatus 10 includes a magnet unit 11 that has a main magnet 12 for generating a strong and, for example, temporally constant main magnetic field 13. In addition, the magnetic resonance apparatus 10 includes a patient receiving region 14 to accommodate a patient 15. In the present exemplary embodiment, the patient receiving region 14 is configured cylindrical and is surrounded cylindrically in a circumferential direction by the magnet unit 11. In principle, however, an embodiment of the patient receiving region 14 deviating therefrom may be provided. The patient 15 may be pushed by a patient positioning apparatus 16 of the magnetic resonance apparatus 10 into the patient receiving region 14. For this purpose, the patient positioning apparatus 16 has a patient table 17 that is configured to be movable within the patient receiving region 14.

The magnet unit 11 also has a gradient coil unit 18 for generating magnetic field gradients that are used for spatial encoding during an imaging process. The gradient coil unit 18 is controlled by a gradient control unit 19 of the magnetic resonance apparatus 10. The magnet unit 11 also includes a radio frequency antenna unit 20 that is configured in the present exemplary embodiment as a body coil that is firmly integrated into the magnetic resonance apparatus 10. The radio frequency antenna unit 20 is controlled by a radio frequency antenna control unit 21 of the magnetic resonance apparatus 10 and radiates radio frequency signals (e.g., radio frequency pulses) into an examination space that is substantially formed by a patient receiving region 14 of the magnetic resonance apparatus 10. By this, an excitation of atomic nuclei by the main magnetic field 13 generated by the main magnet 12 takes place. By way of relaxation of the excited atomic nuclei, magnetic resonance signals are generated. The radio frequency antenna unit 20 is configured for receiving the magnetic resonance signals.

For controlling the main magnet 12, the gradient control unit 19 and, for controlling the radio frequency antenna control unit 21, the magnetic resonance apparatus 10 has a system control unit 22. The system control unit 22 centrally controls the magnetic resonance apparatus 10 (e.g., the execution of a pre-determined imaging gradient echo sequence). The system control unit 22 includes a software-containing part $22_{SW}$ and a hardware-containing part $22_{HW}$. The software-containing part $22_{SW}$ may, for example, include a control and reconstruction computer for evaluating the magnetic resonance signals that are captured during the magnetic resonance investigation. The control and reconstruction computer may include, for example, one or more computers (e.g., with an FPGA control map). In one embodiment, the hardware-containing part $22_{HW}$ is configured in that real time requirements (e.g., hard real time requirements) are applied and/or are to be complied with. For example, the hardware-containing part $22_{HW}$ is configured in that a precisely clocked processing of the control signal takes place. Further, the magnetic resonance apparatus 10 includes a user interface 23 that is connected to the system control unit 22. Control information such as, for example, imaging parameters and reconstructed magnetic resonance mappings may be displayed on a display unit 24 (e.g., on at least one monitor) of the user interface 23 for medical operating personnel. In addition, the user interface 23 has an input unit 25 by which the information and/or parameters may be input by the operating medical personnel during a scanning procedure.

The magnetic resonance apparatus 10 further includes a trustworthy component (not shown in FIG. 1) that is configured to be arranged in a control path of a safety-relevant function of a magnetic resonance apparatus, so that when the trustworthy component is arranged in the control path, the control path is trustworthy at least in parts. For example, the trustworthy component guarantees that an item of control information processed in the control path has at least one predetermined property in a portion of the control path following the trustworthy component (e.g., in the direction of a command execution unit of the magnetic resonance apparatus 10 that executes a control command corresponding to the control information item). In one embodiment, the magnetic resonance apparatus may thereby be operated with a high degree of safety, since by way of the trustworthy component, it is prevented that the control information item in the subsequent portion of the control path is such that the patient 15 and/or the magnetic resonance apparatus 10 is endangered. The trustworthy component may therefore represent a barrier to possibly dangerous control information.

In each of FIGS. 2-5, a magnetic resonance apparatus 10 has a trustworthy component 26 that is in a control path of a safety-relevant function of the magnetic resonance apparatus 10. A safety-relevant function may include, for example, a radio frequency chain (e.g., a radio frequency transmitting chain for transmitting radio frequency signals) and/or a gradient chain.

The radio frequency chain includes the user interface 23, the software-containing part $22_{SW}$ and the hardware-containing part $22_{HW}$ of the system control unit 22, the radio frequency antenna control unit 21, and the radio frequency antenna unit 20. The radio frequency antenna unit 20 may include, for example, a body coil firmly installed in the magnetic resonance apparatus or a local coil that is configured for transmitting radio frequency signals. The magnetic resonance apparatus further includes a radio frequency receiving chain (not shown in detail here) for receiving radio frequency signals (e.g., for receiving magnetic resonance signals).

The gradient chain includes the user interface 23, the software-containing part $22_{SW}$ and the hardware-containing part $22_{HW}$ of the system control unit 22, the gradient control unit 19, and the gradient coil unit 18. The gradient coil unit 18 may include, for example, three gradient coils (e.g., for generating a gradient field), one for each of the three spatial directions.

The control path extends from left to right in FIGS. 2-5 (e.g., a stream of a control information item, such as a control information stream, runs from left to right). With the aid of the control information and/or a control information stream, a control command is executed and/or a control task is carried out. The left end of the control path herein forms the user interface 23 as a command source unit of the control path. The command source unit is configured to generate a control command (e.g., the control command has its origin and/or is initiated here).

The right end of the control path here forms the radio frequency antenna unit 20 for the radio frequency chain and/or the gradient coil unit 18 for the gradient chain. The command execution unit of the control path of the radio frequency chain is the radio frequency antenna unit 20; the command execution unit of the gradient chain is the gradient coil unit 18. The command execution unit is configured to execute a control command (e.g., the control command is herein realized for the purpose of the control command in that, for example, a radio frequency pulse is radiated into the patient receiving region 14 and/or a gradient field is generated in the patient receiving region 14).

The generation of radio frequency pulses and gradient fields represent safety-relevant functions of the magnetic resonance apparatus since an exceeding of limit values may lead to an endangering of the patient 15.

The trustworthy component 26 forms a barrier that separates the control path into a trustworthy portion VA (e.g., along the control path after the trustworthy component 26, such as from the trustworthy component 26 to the command execution unit) and a non-trustworthy portion (e.g., along the control path before the trustworthy component 26, such as from the trustworthy component 26 to the command source unit). In the non-trustworthy portion NVA, lesser demands apply, for example, with regard to a safety argument, so that the non-trustworthy portion may be developed to be less complex.

Figure 2:
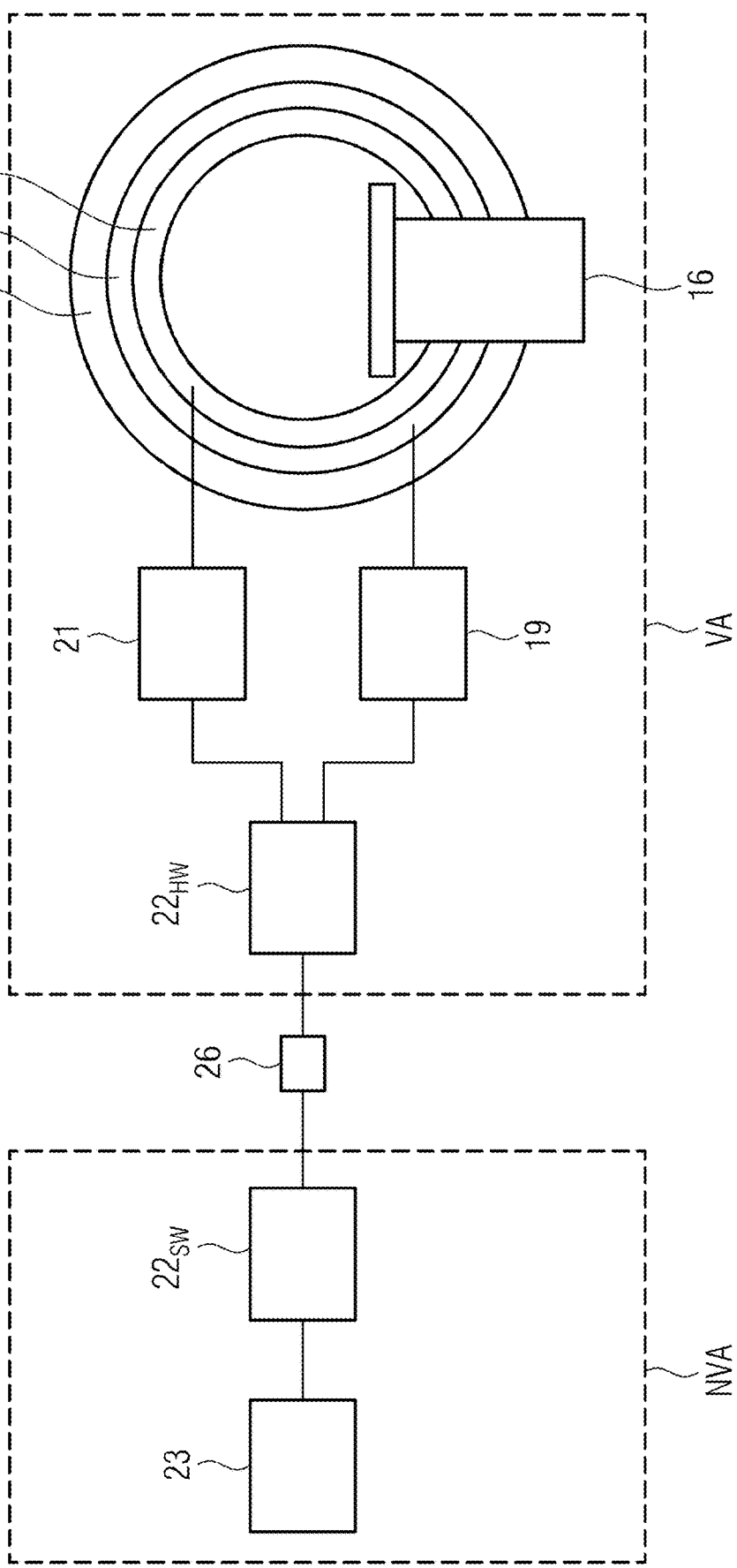
FIGS. 2 to 5 each show a magnetic resonance apparatus with a trustworthy component in different positions.

In FIG. 2, an embodiment, in which the trustworthy component 26 is arranged at the transition between a software portion including the user interface 23 and the software-containing part $22_{SW}$ of the system control unit 22 and a hardware part of the control path, is shown. Via the positioning of the trustworthy component 26 between the software part and the hardware part, it may be achieved, for example, that a development of the software according to class C requirements under IEC 62366 before the trustworthy component 26 in the trustworthy portion VA is not required.

Figure 3:
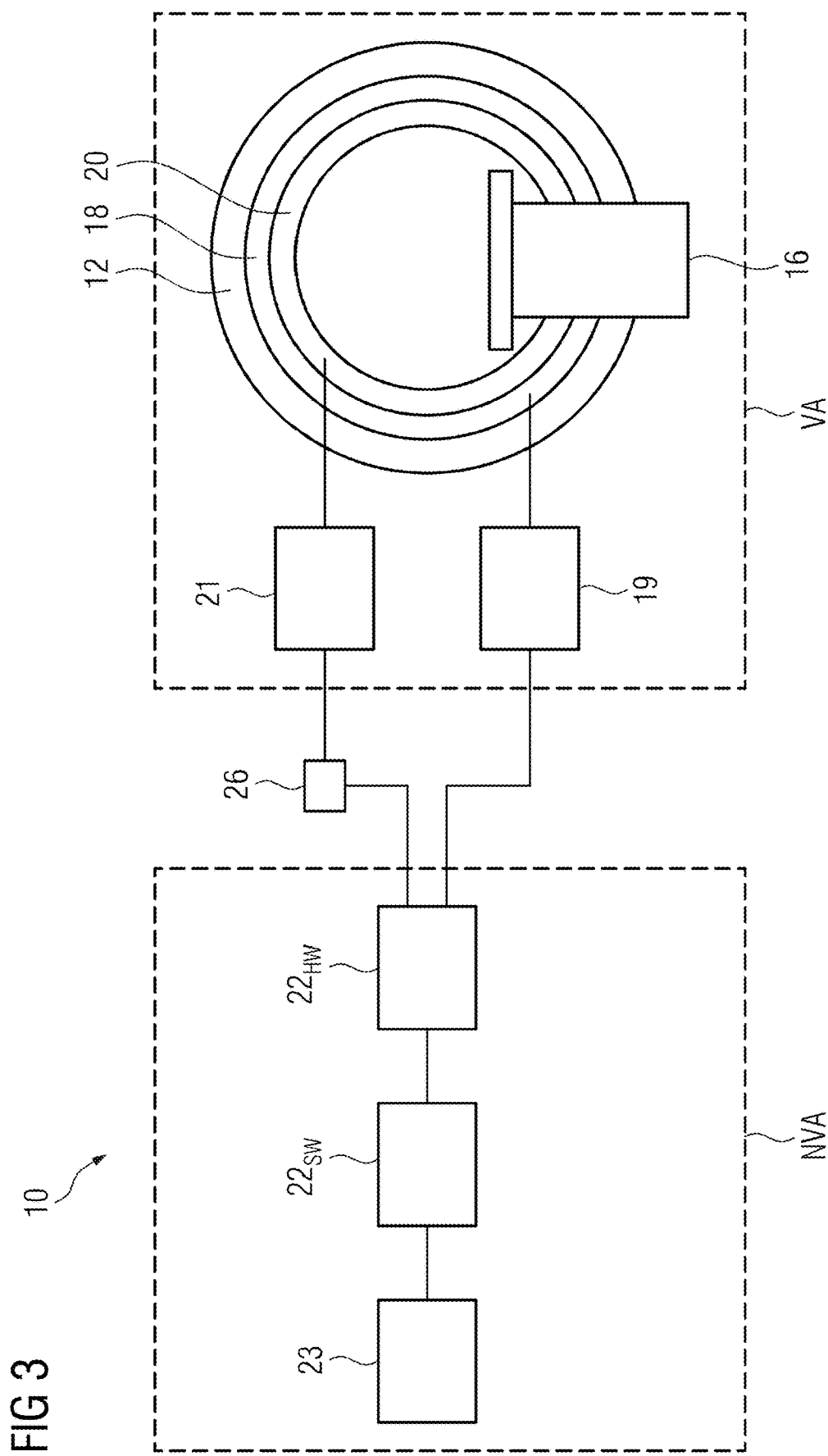

According to FIG. 3, the trustworthy component 26 is situated between the hardware-containing part $22_{SW}$ of the system control unit 22 and the radio frequency antenna control unit 21, so that the non-trustworthy portion NVA of the control path includes the part of the user interface 23 relating to the radio frequency chain and the system control unit 22 (e.g., the software-containing part $22_{SW}$ and the hardware-containing part $22_{HW}$ of the system control unit 22). According to FIG. 4, the trustworthy component 26 is situated between the hardware-containing part $22_{SW}$ of the system control unit 22 and the radio frequency antenna control unit 21, so that the non-trustworthy portion NVA of the control path includes the part of the user interface 23 relating to the gradient chain and the system control unit 22 (e.g., the software-containing part $22_{SW}$ and the hardware-containing part $22_{HW}$ of the system control unit 22). The trustworthy component 26 processes at these positions a data stream (e.g., a continuous and/or digital data stream) in real time. From the position of the trustworthy component 26 as far as the radio frequency antenna unit 20 in the trustworthy portion VA, only one further transformation of the signal course of the control signal takes place, but no complex algorithm for the modification of the control signal. Rather, in the trustworthy portion VA, an execution of the control signal takes place. Although the data stream of the control system may then still be significantly modified after the position of the trustworthy component 26, the original control instruction may no longer be modified; rather, merely a correct execution of the control instruction takes place with the aid of the hardware. For this purpose, thoroughly complex calculations may certainly be required, but the intended effect may no longer be changed.

Figure 4:
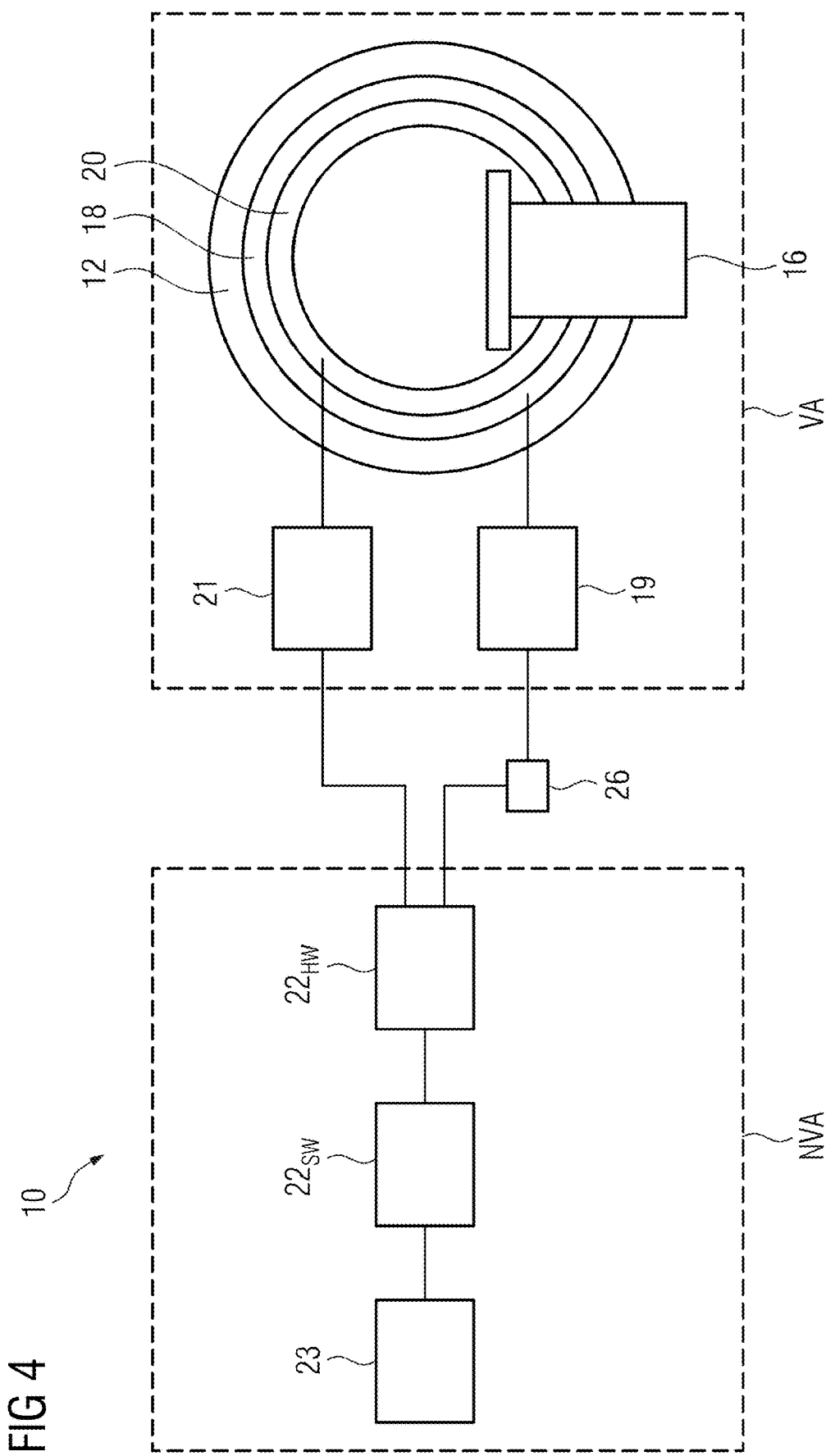
Figure 5:
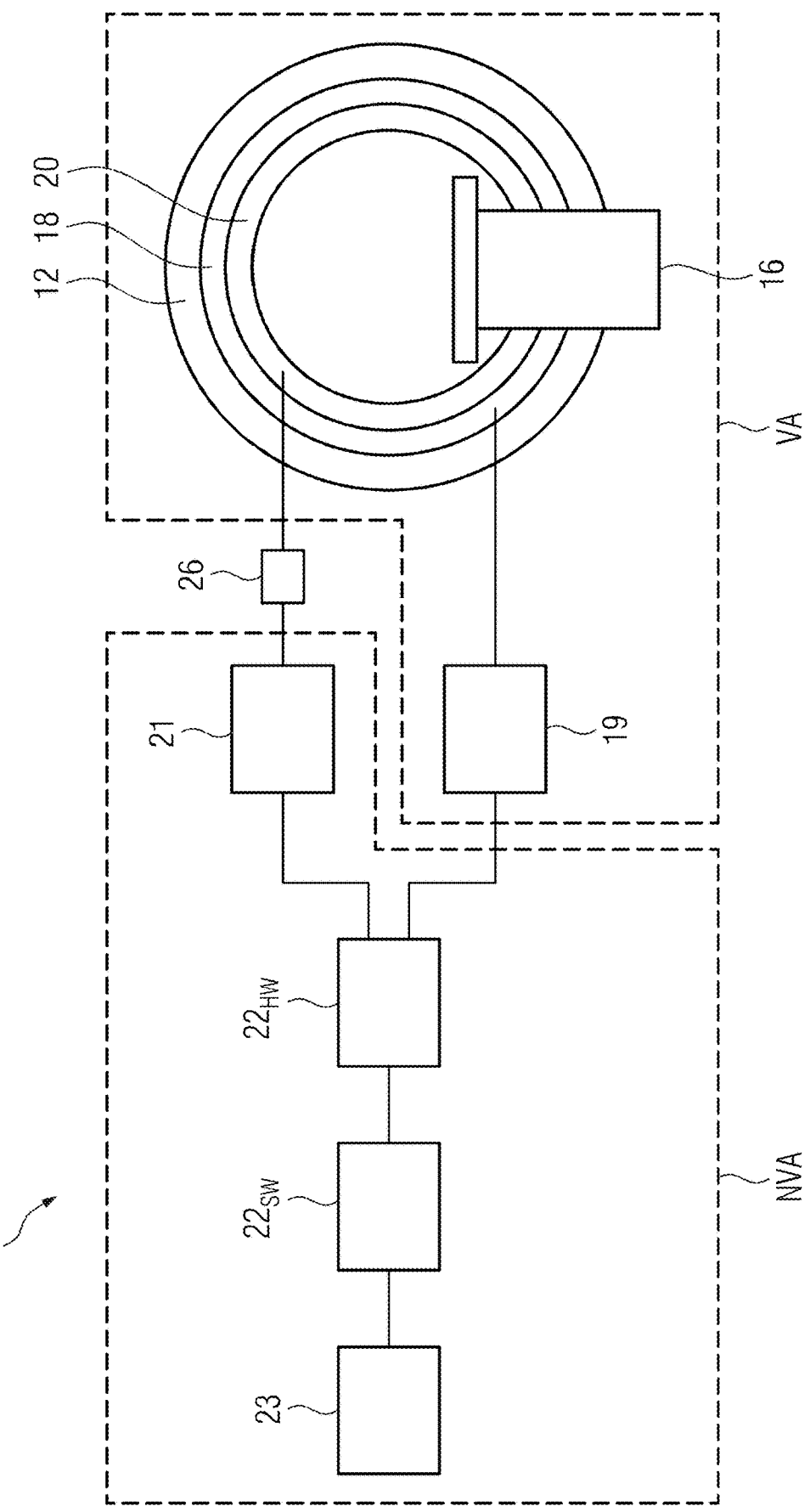

According to FIG. 4, the trustworthy component 26 is situated between the radio frequency antenna control unit 21 and the radio frequency antenna unit 20, so that the non-trustworthy portion NVA of the control path includes the part of the user interface 23 relating to the radio frequency chain and the system control unit 22 (e.g., the software-containing part $22_{SW}$ and the hardware-containing part $22_{HW}$ of the system control unit 22) and the radio frequency antenna control unit 21. In this exemplary embodiment, the trustworthy component 26 is arranged particularly close to the radio frequency antenna unit 20 (e.g., more precisely, directly in front of the command execution unit). The trustworthy component 26 is, for example, therefore displaced as far back as possible in the processing chain. For example, via the trustworthy component 26, a capture takes place of analogue signals that are evaluated. The evaluation and a possibly necessary safety measure for safe operation of the safety-relevant function take place in compliance with higher-order temporal requirements.

In FIGS. 2-5, only exemplary embodiments that may be modified in various ways by a person skilled in the art without departing from the scope of the invention are shown. Further, alternative positions may be provided.

Further, the use of the indefinite article "a" or "an" does not preclude the possibility that the relevant features may also be present plurally. Similarly, the expression "unit" does not preclude the relevant components consisting of a plurality of cooperating sub-components that may also be spatially distributed if relevant.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A trustworthy component that is configured to be arranged in a control path of a magnetic resonance apparatus, the trustworthy component being a barrier that divides the control path into a first portion and a second portion, the trustworthy component comprising:
   an input configured to receive an item of control information from a first additional component of the control path;
   a processor configured to:
      test a signal input of the trustworthy component;
      pass the item of control information to an output of the trustworthy component when the test is a positive test; and
      stop execution of the item of control information or modify the item of control information when the test is a negative test; and
   the output configured to output the item of control information to a second additional component of the control path when the test is a positive test,
   wherein when the trustworthy component is arranged in the control path, an item of control information processed in the control path has at least one predetermined property in a portion of the control path subsequent to the trustworthy component.

2. A magnetic resonance apparatus comprising:
   at least one trustworthy component arranged in at least one control path of the magnetic resonance apparatus, so that an item of control information processed in the at least one control path has at least one predetermined property in a portion of the at least one control path subsequent to the at least one trustworthy component, a trustworthy component of the at least one trustworthy component being a barrier that divides a control path of the at least one control path into a first portion and a second portion, the trustworthy component comprising:
      an input configured to receive an item of control information from a first additional component of the control path;
      a processor configured to:
         test a signal input of the trustworthy component;
         pass the item of control information to an output of the trustworthy component when the test is a positive test; and
         stop execution of the item of control information or modify the item of control information when the test is a negative test; and
      the output configured to output the item of control information to a second additional component of the control path when the test is a positive test; and
   the at least one control path.

3. The trustworthy component of claim 1, wherein the control path is a control path of a safety-related function of the magnetic resonance apparatus.

4. The magnetic resonance apparatus of claim 2, wherein a control path of the at least one control path is a control path of a safety-relevant function of the magnetic resonance apparatus.

5. The magnetic resonance apparatus of claim 2, wherein the at least one control path has a command source unit configured to generate a control command,
   wherein the at least one control path has a command execution unit configured to execute the control command,
   wherein the command source unit and the command execution unit are arranged at different ends of a control path of the at least one control path in which the control command is processed, and
   wherein the at least one trustworthy component is arranged between the command source unit and the command execution unit.

6. The magnetic resonance apparatus of claim 2, wherein the at least one control path has a radio frequency chain, wherein the radio frequency chain has a software part with a user interface, wherein the radio frequency chain has a hardware part with a radio frequency antenna control unit, a radio frequency antenna unit, or the radio frequency antenna control unit and the radio frequency antenna unit, and wherein the at least one trustworthy component is arranged between the software part and the hardware part.

7. The magnetic resonance apparatus of claim 2, wherein the at least one control path has a radio frequency chain, wherein the radio frequency chain has a user interface, a system control unit, a radio frequency antenna control unit, and a radio frequency antenna unit, wherein the at least one trustworthy component is arranged between the user interface and the system control unit, between the system control unit and the radio frequency antenna control unit, or between the radio frequency antenna control unit and the radio frequency antenna unit.

8. The magnetic resonance apparatus of claim 2, wherein the at least one control path has a gradient chain, wherein the gradient chain has a software part with a user interface, wherein the gradient chain has a hardware part with a gradient control unit, a gradient coil unit, or the gradient control unit and the gradient coil unit, and wherein the at least one trustworthy component is arranged between the software part and the hardware part.

9. The magnetic resonance apparatus of claim 2, wherein the at least one control path has a gradient chain, wherein the gradient chain has a user interface, a system control unit, a gradient control unit, and a gradient coil unit, and wherein the at least one trustworthy component is arranged between the user interface and the system control unit, between the system control unit and the gradient control unit, or between the gradient control unit and the gradient coil unit.

10. The magnetic resonance apparatus of claim 5, wherein the at least one trustworthy component is arranged in the control path closer to the command execution unit than to the command source unit.

11. The magnetic resonance apparatus of claim 5, wherein the control path has a software part and a hardware part, and wherein the at least one trustworthy component is arranged at a transition between the software part and the hardware part.

12. The magnetic resonance apparatus of claim 10, wherein the at least one trustworthy component is arranged in the control path, directly before the command execution unit.

* * * * *